ns patent [19] [11] 4,438,245
Satomura [45] Mar. 20, 1984

[54] POLYMERS CONTAINING AROMATIC SULFONIC ACID ESTER OR AMIDE GROUPS

[75] Inventor: Masato Satomura, Saitama, Japan

[73] Assignee: Fuji Photo Film Co., Ltd., Kanagawa, Japan

[21] Appl. No.: 407,034

[22] Filed: Oct. 16, 1973

[30] Foreign Application Priority Data

Oct. 18, 1972 [JP] Japan ................................. 47-103550

[51] Int. Cl.³ .................... C08F 12/30; C08F 16/30; C08F 20/50; C08F 28/04
[52] U.S. Cl. .................................. 526/286; 526/243; 526/280; 526/287; 526/288; 526/923; 204/159.15
[58] Field of Search ............. 260/47 UA, 79.3 M, 49, 260/78.4 R, 78.4 N, 63 K, 63 UY; 526/286, 243, 280, 287, 288

[56] References Cited

U.S. PATENT DOCUMENTS

| | | | |
|---|---|---|---|
| 2,694,699 | 11/1954 | Laakso et al. ...................... | 260/79.3 |
| 2,796,414 | 6/1957 | Lowther et al. .................... | 260/79.3 |
| 3,033,833 | 5/1962 | Le Fevre et al. .................. | 260/79.3 |
| 3,256,252 | 6/1966 | Kruckenberg et al. ............ | 260/79.3 |

*Primary Examiner*—Ronald W. Griffin
*Attorney, Agent, or Firm*—Sughrue, Mion, Zinn, Macpeak & Seas

[57] ABSTRACT

A composition for use in light-sensitive elements which comprises a functional group containing polymer having aromatic sulfonic acid ester or amido groups and sensitizer and a process for preparing the functional polymer and light-sensitive element employing the functional polymer.

19 Claims, No Drawings

POLYMERS CONTAINING AROMATIC SULFONIC ACID ESTER OR AMIDE GROUPS

BACKGROUND OF THE INVENTION

1. Field of the Invention

The present invention relates to a novel polymer having a sulfonic acid ester group and a method for forming a relief, a printing plate or a photographic duplicate by using the polymer.

2. Description of the Prior Art

Heretofore, many studies have been made on the systems which undergo changes in solubility, adhesiveness, hardness or the like at the areas irradiated with light or electromagnetic waves, and some of them are being put into practice.

In the prior art, many studies have been made on light-sensitive compounds such as $\alpha,\beta$-unsaturated carboxylic acid derivatives and $\alpha,\beta$-unsaturated carbonyl compounds (for example, (1) J. Kosar, *Light Sensitive Systems*, John Wiley & Sons, New York, 1965, Chap. IV; (2) A. Schönberg, *Preparative Organic Photochemistry*, Springer-Verlag, New York, 1968, Chap. 8). In particular, the photoaddition four-membered ring-forming reaction of cinnamic acid derivatives has been studied extensively among the unsaturated carboxylic acids (for example, (3) P. Silber, *Ber. dtsch. Chem. Ges.*, 35, 4128 (1902)) and, furthermore, the application of high molecular weight compounds having cinnamic acid ester groups to a light-sensitive system has also been well studied (for example, Silber, ibid., U.S. Pat. Nos. 2,835,656; 3,357,831; 3,737,319; 3,418,295; 3,647,470; 3,409,593; 2,956,878; 3,173,787; 3,023,100; 3,066,117; and 3,756,820 and British Pat. No. 695,197).

The inventor has previously developed an image-forming method utilizing, as the novel light-sensitive polymer compound not described in the above-described studies, a high molecular compound having $\beta$-aryl-$\alpha,\beta$-unsaturated sulfonic acid ester groups or amido groups.

As a result of further investigations, the inventor has now discovered that sulfonic acid ester group containing polymers having no unsaturated bond at the $\alpha,\beta$-position also exhibit extremely good light-sensitivity, and thus developed the present invention.

SUMMARY OF THE INVENTION

That is, the present invention is concerned with a novel polymer and an image-forming method comprising using a polymer compound having aromatic sulfonic acid ester groups or sulfonamido groups. The polymer of this invention contains therein repeating units of the following general formulas (a) $R_1SO_2XR_2OC(-R_3)(-CH_2-)$ (b) $R_1SO_2XR_4OCO-C(-R_3)(-CH_2-)$ (c) $R_1SO_2XR_5$—[phenyl]—$C(-R_3)(-CH_2-)$ (d) $-XO_2S-R_6-SO_2X-R_7-$ (e) $R_1SO_2XC(-R_3)(-CH_2-)$ wherein $R_1$ is

[R_8-phenyl or R_8-naphthyl with R_9];

$R_2$ is $-(CH)_{\overline{m}}(CH_2)_{\overline{n}}-$ with $CH_3$, $-(CH)_{\overline{m}}(CH_2)_{\overline{n}}-$ with $CH_2Cl$, $-CH_2CH_2-(OCH_2CH_2)_{\overline{n}}-$, $-CH_2CH_2-(SCH_2CH_2)_{\overline{n}}-$, $-(CH)_{\overline{m}}(CH_2)_{\overline{n}}O-$[phenyl]$-(CH_2)_{\overline{n}}-$ with $CH_3$, or $-(CH_2)_{\overline{n}}-$[phenyl]$-(CH_2)_{\overline{n}}-$;

$R_3$ is a hydrogen atom or a methyl group;

$R_4$ is $-CH_2CH_2-$, $-CH_2CH_2-CH_2-$, $-CH_2-CH-$ with $CH_2Cl$, $-CH_2CH-$ with $CH_3$, $-CH_2CH_2-(OCH_2CH_2)_{\overline{n}}-$, $-CH_2-CH-$ with $C_2H_5$ or $-CH_2CH-(OCH_2CH)_{\overline{n}}-$ with $CH_3$, $CH_3$;

$R_5$ is $-(CH_2)_{\overline{m}}-$;

m is 0 or 1;

n is 1, 2, 3 or 4;

X is $-O-$, $-S-$, $-NH-$ or $-NR_{10}-$ $R_6$ is

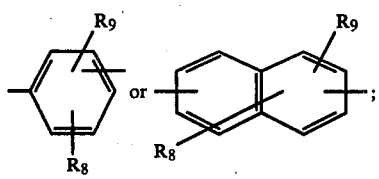

$R_7$ is as described for $R_2$, and $R_4$ or $-(CH_2CH_2)_{\overline{n}}$;

$R_8$ is a hydrogen atom, a chlorine atom, a fluorine atom, a bromine atom, $H-(CH_2)_{\overline{n}}$, $H-(CH_2)_{\overline{n}}O-$, a nitro group, a sulfo group or carboxy group;

$R_9$ is a hydrogen atom, a chlorine atom, a bromine atom, $H-(CH_2)_{\overline{n}}$, $H-(CH_2)_{\overline{n}}O-$, a nitro group, a sulfo group, a carboxy group, a cyano group, a phenyl group, a phenoxy group, an acetyl group, or a benzoyl group; and $R_{10}$ is

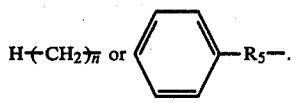

DETAILED DESCRIPTION OF THE INVENTION

A suitable nucleus for use in the polymer compound is a benzene nucleus, a naphthalene nucleus, an anthracene nucleus, an azulene nucleus, a heterocyclic ring such as a furan ring, a thiophene ring, a benzofuran ring, etc., and the substituted derivatives thereof having substituents such as an alkyl group having less than 7 carbon atoms, such as methyl, ethyl, isopropyl, n-propyl, sec-butyl, t-butyl, t-amyl, n-hexyl, 2-chloroethyl, 2-methoxyethyl, carboxymethyl, benzyl, nitrobenzyl, etc.; a halogen atom, such as a chlorine atom or a bromine atom; alkoxy group having less than 6 carbon atoms, such as methoxy, thiomethoxy, ethoxy, propoxy, amyloxy and aryloxy groups having less than 7 carbon atoms such as phenoxy, thiophenoxy, etc.; an acyl group having less than 7 carbon atoms, such as acetyl, propionyl, acryloyl, benzoyl, etc.; a nitro group; a carboxy group; a sulfo group; a cyano group; a carbomoyl group; an amino group, such as dimethylamino, diethylamino, acylamino, etc.

First, as the processes for producing the polymer compound used in the invention, the following processes are suitable, any one of which being conveniently employed.

(1) A process utilizing the reaction of a polymer; which comprises reacting a synthetic or natural polymer compound having reactive groups such as hydroxy, amino, lower alkyl amino, or mercapto groups, with an aromatic sulfonic acid halide in the presence of a base, or reacting an epoxy ring-containing polymer compound directly with an aromatic sulfonic acid.

(2) A process utilizing a vinyl polymerization reaction; which comprises homo-polymerizing or copolymerizing a monomer having both an addition-polymerizable group and an aromatic sulfonic ester or amido group.

(3) A process utilizing a condensation polymerization reaction, which comprises reacting an aromatic dichlorosulfonyl compound with a diol, an amino alcohol or a diamine in the presence of a base.

The high polymer compound of this invention suitably has a $[\eta]$ in dimethylformamide or methylethylketone of 0.01–3.0, preferably 0.2–1.5 at 30° C. and a degree of substitution of at least 0.05 mole percent, preferably larger than 0.2 mole percent.

As the synthetic or natural polymer compounds which can be used in process (1), there are synthetic polymer compounds such as polyvinylalcohol, polyethyleneimine, the hydrolyzed products of homo- or copolymers of vinyl acetate such as polyvinylacetate partial hydrolysis products, ethylene-vinylacetate copolymer hydrolysis products, etc.; hydroxy containing, amino containing or mercapto containing monomer copolymers with monomers such as chlorostyrene, methoxystyrene, styrene, methacrylic acid esters, and acrylic acid esters (such as the methyl, ethyl, propyl, butyl, hexyl, methoxyethyl, methoxyethoxyethyl, benzyl, glycidyl and lauryl esters), ethylene, vinyltoluene, vinylacetate, vinylpyrrolidone, etc., in which the hydroxy, mercapto, or amino containing monomer has the formula

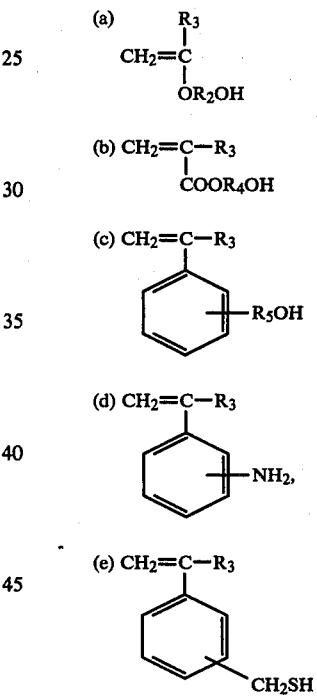

wherein $R_2$–$R_5$ is the same as described before, glycidyl acrylate or methacrylate copolymers; epoxy resins; alkyd resins such as glycerin phthalic acid, or glycerin adipic acid; polyvinyl amine as disclosed in Hart, *Makromol Chem.*, 3251 (1959); etc., and natural polymer compounds such as partially acylated cellulose, hydroxyalkyl celluloses such as hydroxy methyl, hydroxyethyl or hydroxypropyl cellulose, gelatin, starch, etc.

Of the hydroxy, mercapto and amino containing monomers preferred monomers are as follows;

(1) $CH_2=CHCOOCH_2CH_2OH$
(2) $CH_2=CHCOOCH_2CH_2CH_2OH$
(3) $CH_2=CHCOOCH_2CH(CH_3)OH$
(4) $CH_2=C(CH_3)COOCH_2CH_2OH$
(5) $CH_2=C(CH_3)COOCH_2CH_2CH_2OH$
(6) $CH_2=C(CH_3)COOCH_2CH(CH_3)OH$
(7) $CH_2C(CH_3)COOCH_2CH(CH_2Cl)OH$
(8) $CH_2=CHCOOCH_2CH(CH_2Cl)OH$

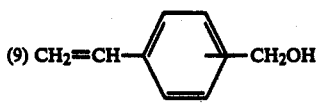

(10) CH$_2$=C(CH$_3$)COOCH$_2$CH$_2$OCH$_2$CH$_2$OH

The preferred aromatic sulfonic acid halides which can be used are of the general formulas

wherein R$_8$ and R$_9$ are as hereinbefore described but

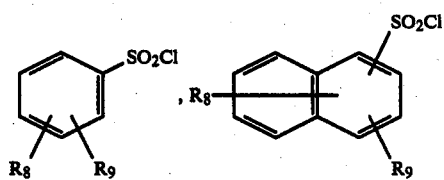

can also be used. Specific examples of aromatic sulfonic acid halides, are benzenesulfonyl chloride, toluenesulfonyl chloride, nitrobenzenesulfonyl chloride, nitrochlorobenzenesulfonyl chloride, nitrotoluenesulfonyl chloride, naphthalenesulfonyl chloride, nitronaphthalenesulfonyl chloride, methoxybenzenesulfonyl chloride, and the like.

The aromatic sulfonyl halide used in this invention is very stable against humidity or water (for example, an aromatic sulfonyl chloride is not hydrolized by cold water) compared with that of a carboxylic acid chloride such as cinnamic acid, furylacrylic acid, acrylic acid, methacrylic acid, and sorbic acid chloride which are easily hydrolized in air with fuming. This is very important characteristics on reaction or on storage.

Since humidity does not substantially inhibit the reaction of the sulfonyl halide with the hydroxy, mercapto or amino group, the conversion is high hydrolized products such as the sulfonic acid do not result.

Further, aromatic sulfonyl chloride is easily synthesized in one step by treating an aromatic compound with chlorosulfonic acid. Of course, the aromatic sulfonic chloride can be obtained by treating an aromatic sulfonic acid with phosphorus pentachloride but the use of chlorosulfonic acid is more convenient and the raw materials are less expensive compared with the latter process.

Some of sulfonic acid chlorides such as benzene sulfonic acid chloride, toluene sulfonic acid chloride, m-acetyl benzenesulfonyl chloride, p-bromobenzenesulfonyl chloride, p-chlorobenzenesulfonyl chloride, chloro-3-nitrobenzenesulfonyl chloride, 5-chlorosulfonyl-o-anisic acid, dansyl chloride, 5-dimethylamino-1-naphthalenesulfonyl chloride, 2,4-dinitrobenzenesulfonyl chloride, ethyl-4-chloro-2-p-fluorosulfonylphenyl-6-quinoline carboxylate, 4-fluorobenzenesulfonyl chloride, acenaphthenesulfonyl chloride, p-fluorosulfonyl- benzoic acid, mesitylenesulfonyl chloride, methoxybenzenesulfonyl chloride, 2-naphthalene-sulfonyl chloride, o-nitrobenzenesulfonyl chloride, pentafluorobenzenesulfonyl chloride, 8-quinoline sulfonyl chloride, trisisopropylbenzenesulfonyl chloride are commercially available.

Also, as the base used in process (1), various inorganic or organic base catalysts which are employed for conventional esterification reactions and amidation reactions can be utilized.

Suitable bases which can be employed in process (1) are bases such as pyridine, picoline, quinoline, triethylamine, triethylenediamine, N,N'-dimethylpiperadine, N-methylmorpholine, dimethylaniline, diethylaniline, sodiumhydroxide, potassium hydroxide, sodium carbonate, basic anion exchange resins. Of these the ones most generally employed are pyridine, triethyl amine and sodium hydroxide. The amount of base generally used is 0.05–200 mole percent, preferably 0.2–2 molar equivalent to the hydroxy group, the amino group or the mercapto group. Where organic bases are used, it is necessary to maintain the reaction temperature less than 40° C., preferably less than 30° C., in order to minimize side reactions. Also, where inorganic bases are used, it is important to maintain the reaction temperature low in order to minimize hydrolysis of the ester produced. Generally a temperature of about 10° to 25° C. is employed. Partial quaternization using a tertiary amine such as pyridine, triethylamine, triethanolamine is also useful to make the polymer water soluble and to use water as a processing solution.

As the monomers to be used in process (2), there are aromatic sulfonic acid esters or amides of vinyl monomers containing hydroxy, mercapto, or amino group(s), such as β-hydroxyalkyl acrylate, hydroxyalkyl acrylamide, alkylene glycol monoacrylate, aminoalkyl acrylamide, dihydroxypropyl acrylate, those methacrylates or methacrylamides corresponding to the previously recited acrylates and acrylamides, aminostyrene, hydroxystyrene, hydroxyalkylstyrene, hydroxyethyl vinyl ether, etc., and those prepared by reacting, reversely, aromatic sulfonic acid esters containing a hydroxy group or amino group with a vinyl group-containing compound such as acrylic acid. Furthermore, vinyl sulfonate compounds such as vinyl toluenesulfonate can also be used. Of these, following monomers are most useful

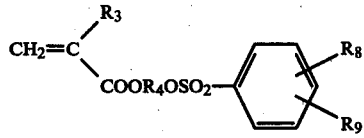

wherein R$_3$, R$_4$, R$_8$ and R$_9$ are defined hereinbefore.

As the monomer copolymerizable with the above-described monomers, ethylene, butadiene, vinyl chloride, vinylidene chloride, vinyl acetate, vinyl propionate, styrene, vinyl toluene, chlorostyrene, nitrostyrene, acrylic acid, methacrylic acid, maleic anhydride, acrylamide, acrylonitrile, methacrylic acid esters or acrylic acid esters (for example, the methyl, ethyl, ethylhexyl, methoxybutyl, hydroxyethyl, dihyroxypropyl, or glycidyl esters), cellosolve acrylate, vinyl pyrrolidone, vinyl sulfonic acid, maleic anhydride, alkyl vinyl ethers such as vinyl butyl ether, etc. can be used. Preferred comonomers can be easily and freely changed according to the polymer characteristics, desired. For example, if adhesivity or flexibility is desired, acrylonitrile, acrylic acid ester or methacrylic acid ester can be used as comonomers. If water solubility is desired, vinyl pyrolidone, vinyl methyl ether, hydroxy alkyl acrylate, hydroxy alkyl acrylamide, or methacrylate, methacryl amide, acryl amide, sulfopropyl acrylate, vinylbenzenesulfonic acid can be employed. The comonomer ratio is closely related to reactivity and, at least 0.001 mole percent of the monomer and preferably, 0.05 mole percent of the monomer is generally used, for example, for a light-sensitive polymer.

In the polymerization of these monomers, conventional techniques known for the polymerization of acrylic acid derivatives, methacrylic acid derivatives or vinyl esters can conveniently be employed. More specifically, in process (2) a vinyl polymerization method is employed utilizing generally, temperatures of about −80°−+80° C., a time of about 2 minutes–15 hrs. and with a comonomer present a molar ratio of at least 0.001 mol%, preferably 0.05 mole %, of the monomer and a vinyl polymerization catalyst. These general procedures can be modified and applied based on knowledge in the art, as disclosed in "Preparative Methods of Polymer Chemistry" by W. R. Sorensen et al., John Wiley & Sons, New York, (1961), "Polymer Handbook" 3rd printing by E. H. Immergut et al, John Wiley & Sons, New York (1967) and Murahashi, "Synthetic Polymer", 1972, Asakura, Tokyo and the cited references therein.

When the polymerization reaction is carried out, a radical polymerization catalyst or ionic polymerization catalyst can be used according to the reaction or the physical properties of the final product polymer. For example, such a catalyst can be chosen from azo compounds (for example, azobisisobutyronitrile), peroxides (for example, benzoyl peroxide), peracid esters, persulfates, aluminum chloride, triethyl aluminum, boron trifluoride, boron fluoride/ether adduct, and diethyl zinc. Generally the total amount of the catalyst will range form about 0.01–20 wt% to the amount of monomer. The catalyst ratio to monomer is closely related to the molecular weight of the polymer to be obtained. Too much catalyst decreases the molecular weight and broadens the molecular weight distribution of the polymer. Suitable polymerization techniques which can be employed are bulk polymerization, solution polymerization, suspension polymerization, emulsion polymerization or graft polymerization.

Needles to say, other polymers such as ethylene-vinylacetate copolymer, polyvinylacetate, polymethylmethacrylate or polyvinyl acetal, dyes, or pigments, such as quinacridone, phthalocyanine, phthalocyanine blue or porphyrin metal complexes, etc. can be present during the polymerization reaction. If polymerization is conducted in the presence of these materials, the compatibility, uniformity are largely improved in comparison with these properties when the polymer is mixed with these materials after polymerization.

Representative useful examples of disulfonyl chlorides for process (3) are
1,3-benzenedisulfonyl chloride,
1-chloro-2,4-benzenedisulfonyl chloride,
1-bromo-3,5-benzenedisulfonyl chloride,
1-nitro-3,5-benzenedisulfonyl chloride,
1-cyano-3,5-benzenedisulfonyl chloride,
1-methyl-2,4-benzenedisulfonyl chloride,
1-methyl-4-chloro-2,6-benzenedisulfonyl chloride,
1-ethyl-2,4-benzenedisulfonyl chloride,
1-butyl-2,4-benzenedisulfonyl chloride,
1,2-dimethyl-3,5-benzenedisulfonyl chloride,
1,3-dimethyl-2,4-benzenedisulfonyl chloride,
1,3-dimethyl-4,6-benzenedisulfonyl chloride,
1,4-dimethyl-2,6-benzenedisulfonyl chloride,
1-methoxy-2,4-benzenedisulfonyl chloride;
2,2'-biphenyldisulfonyl chloride,
3,3'-biphenyldisulfonyl chloride,
4,4'-biphenyldisulfonyl chloride,
4,4'-dibromo-3,3'-biphenyldisulfonyl chloride,
4,4'-dimethyl-3,3'-diphenyldisulfonyl chloride;
1,3-naphthalenedisulfonyl chloride,
2,6-naphthalenedisulfonyl chloride,
1-chloro-2,7-naphthalenedisulfonyl chloride,
1-chloro-3,5-naphthalenedisulfonyl chloride,
1-nitro-3,6-naphthalenedisulfonyl chloride,
2-ethoxy-1,6-naphthalenedisulfonyl chloride,
1,5-anthracenedisulfonyl chloride,
1,8-anthracenedisulfonyl chloride, etc.; and the like.

In addition materials such as fluorosulfonylbenzoyl chloride, fluorosulfonylphenylisocyanate, terephthaloyl chloride, adipic acid dichloride tolylenediisocyanate, are also useful in combination with the disulfonyl chloride.

Representative examples of diols, aminoalcohols or diamines which can be used are ethylene glycol, propylene glycol, butylene glycol, diethylene glycol, triethylene glycol, xylylene diol, cyclohexane diol, hexamethylene diol, aminoethanol, ethylene diamine, hexamethylene diamine, phenylenediamine, hydroquinone, p-aminophenol, hydroquinone-bis-hydroxyethyl ether, polyethylene glycol, neopentylene glycol, and bisphenol A.

The thus obtained light-sensitive polymer compounds undergo a change in solubility, adhesiveness, hardness or a like physical property due to the action of electromagnetic waves, bombardment with particles or the like.

Although the precise reaction mechanism for this change has not yet been completely clarified and while not desiring to be bound, the inventor believes the mechanism is as follows.

For those polymer materials which have aromatic sulfonic ester groups as the functional groups, it is assumed that an ester bond cleavage reaction due the action of electromagnetic waves or particles occurs to produce alkoxy free radicals or alkoxy ions. The resulting free radicals or ions cause a hydrogen-removal reaction, a coupling reaction or a disproportionation reaction in the polymer matrix and, as a result, an intermolecular or intramolecular cross-linking reaction occurs causing the material to gel. This assumption is consistent with the report (A.Abad, et al; *Tetrahedron Letters*, 1971, 4555) that an alcohol is obtained in the photolysis of low molecular weight sulfonic acid derivatives. The aromatic sulfonic acid produced in this cleavage reaction is soluble in alkali and is removable by using an organic or inorganic base.

Also, for those polymer materials which have aromatic sulfonamido groups as the functional groups, it is assumed that, in the same manner as described above, imino radicals or imino ions are produced by the cleavage reaction causing an intramolecular or intermolecular cross-linking reaction and gelling. The aromatic sulfonic acid produced at this time similarly can be removed with a base.

While the polymer compound used in the present invention is particularly useful as a light sensitive composition, it is possible to shorten the irradiation time and to produce the desired difference in physical property by adding, as a sensitizing agent, an aromatic carbonyl compound, an aromatic nitro compound, an aromatic quinone, a triphenyl methane, an anthrone, a nitroaniline, an acylated nitroaniline, a thiazole, a benzoylmethylene, a β-naphthothiazoline, a ketone or various photographic sensitizing dyes.

Also, polyfunctional α,β-unsaturated acid derivatives can be used, if desired, in combination with the polymer of this invention to accelerate image formation. Suitable examples of such polyfunctional α,β-unsaturated acid derivative are, for example, ethylene glycol dimethaacrylate, pentaerythrytol tetraacrylate, ethylenediaminediacrylate, paraphenylenediamine disorbamide, etc.

Specific examples of such useful sensitizing compounds are nitro compounds such as p-nitrodiphenyl, 5-nitro-2-aminotoluene 4-nitro-1-aminonaphthalene, 4-nitro-1-acetylaminonaphthalene, picric acid, picramide, dichloronitroanilene, nitroacenaphthene, dinitronaphthalene, trinitrofluorenone, tetranitrocarbazole, dinitrobenzoanthrazenedione, dinitrodimethylacetyl-tert-butylbenzene, dinitrostylbene disulfonic acid, trinitronaphthalene, and dinitrochalcone carbonyl compounds such as benzanthrone, 9-anthraldehyde, acetonaphthone, xanthone, benzophenone, tetramethylaminobenzophenone, tetraethylaminobenzophenone, dimethoxybenzophenone, dimethoxythiobenzophenone, 1-cyano-2-keto-3-methyl-6-bromo-3-azabenzanthrone, 1-carboethoxy-2-keto-3,4-diazabenzanthrone, 2-keto-3-methyl-1,3-diazabenzanthrone, diphthaloylnaphthalene, 2-benzoylmethylene-1-β-naphtothiazoline, 4-H-quinolizine-4-thione, phenanthrenquinone, benzanthraquinone,t-butylanthraquinone, chloroanthraquinone, 2-benzoylmethylene-1-methyl-benzothiazoline, 2-nitrophthaloylmethylene-1-ethyl-benzothiazoline, dimethylcarbamoylmethyleneethylbenzothiazoline, diethylcarbamoylmethyleneethylbenzothiazoline, and dyes such as methyl violet, victoria blue, malachite green, (triphenylmethane dyes) diethyldibenzothiacyanine iodide, diethyldibenzothiacarbocyanine bromide, dimethyldibenzothiacyanine iodide (cyanine, thiocyanine dyes). Other compounds such as methyl-3-ethyl-2-benzothiazolinylidene dithioacetate,2,6-di(p-ethoxyphenyl)-4-(p-n-amyloxyphenyl)thiapyryliumperchlorate (pyrylium salts) are also suitable. Some of these compounds are described in U.S. Pat. Nos. 3,475,617; 3,737,319; 3,453,110; 3,409,593; 3,575,929; 2,835,656; 3,357,831; 3,418,295; 3,647,470; 2,956,878; 3,173,787; 3,023,100; and 3,066,117, and British Pat. No. 659,197. The sensitizer is generally used at a level of 0.1–20 weight percent to the polymer, preferably 3 to 10 weight percent.

In order to form images using the above-described polymers of the present invention, the polymer is dissolved, together with the above-described sensitizing agent, in a solvent at a concentration of 0.5–50 wt.% preferably 2–15 wt.% such as a ketone solvent, an amide solvent, a halogenated aromatic solvent, an aromatic ether solvent, a cellosolve solvent, a halogenated aliphatic solvent, etc., or mixtures thereof, and the resulting solution is applied in a thickness of 0.5–250μ, preferably 2–10μ to a support such as a high polymer film (e.g., a polyethylene film, a terephthalate film, etc.) or a metal plate (e.g., a zinc plate for use in printing, an aluminum plate, a silicon wafer, etc.) using a coating method such as dip-coating, rod-coating, spinner-coating, spray-coating, etc. to prepare a light-sensitive plate. Suitable solvents which can be employed are β-methoxyethanol, β-butoxyethanol, β-acetoxyethanol, β-phenoxyethanol, β-ethoxypropanol, cyclohexanone, methylethylketone, methylisobutylketone, methylcyclohexyl acetate, trichloroethylene, formylmorpholine, dimethylformamide, dimethylacetoamide, pyrolidone, butyrolactone, hexamethylphosphoramide, methylphenylsulfone, acetophenone, dimethoxyethane, dimethoxypropane, diethyleneglycol dimethylether, chlorobenzene, dichlorobenzene, anisole, and the like. Then the resulting light-sensitive plate is exposed while superposing thereon an original to be duplicated. The exposure can be carried out using irradiation of a mercury lamp, a high pressure mercury lamp, a carbon arc lamp, a cathode ray tube, a laser beam, an electron beam, ultraviolet rays, etc., as the energy source. And the irradiation time can be changed easily according to the energy source, distance and sensitizer employed. The exposed plate is processed with a solvent containing a dye or a pigment to obtain more distinct image formation. Conventional usual processing procedures used in general for light-sensitive systems (see for example Kosar "Light Sensitve Systems" 1965, John Wiley & Sons) can be employed with only minor modification. The polymer compound at the image areas does not undergo photo hardening reaction and is dissolved in the solvent, to which areas the dye or pigment adheres to form images.

The present invention will now be described in greater detail specifically by reference to the following synthesis examples of the light-sensitive polymer compound of the present invention and image formation examples. These examples should not be interpreted as limiting the scope of the invention. Unless otherwise indicated all parts and percents are by weight.

SYNTHESIS EXAMPLE 1

5 Grams of hydroxyethyl acrylate-styrene copolymeer ($[\eta]$ at 30° C. in methyl ethyl ketone:0.44; molar composition ratio: approximately 1:1) was completely dissolved in 50 ml of a mixed solvent of dimethylformamide and acetone (1:1 by volume). While stirring, 5.5 g of toluenesulfonyl chloride was gradually added thereto, and the stirring was continued for 30 minutes. Subsequently, a solution prepared by diluting 8.5 ml of pyridine with 20 ml of acetone was gradually added dropwise thereto while externally cooling with ice. After the completion of the dropwise addition, stirring was continued for 2 hours and the mixture was left for one day at a room temperature (approximately 20°–30° C.). Thereafter, the mixture was slowly pourd into a large amount of water to remove the dimethylformamide, pyridine hydrochloride and the like. Thus, a white solid product in a crude yield of about 7 g was obtained. The resulting product was purified by dissolving it in 50 ml of acetone followed by gradually pouring the solution into a large amount of ethylether. This compound was soluble in a mixed solvent of ethyl ether-methanol (1:1 by volume) and its solubility was greatly different from that before the reaction.

SYNTHESIS EXAMPLE 2

The same reaction as described in Synthesis Example 1 was conducted using a hydroxyethyl methacrylate-butyl methacrylate copolymer ($[\eta]$ at 30° C. in methyl ethyl ketone: 0.89; molar composition ratio: approximately 1:1). Substantially the same procedures as described in Synthesis Example 1 were effected to isolate a white solid product. Based on the change in the absorption of the hydroxy group in the infrared absorption spectra between the starting material and the reaction product, the esterification reaction was considered to proceed to more than about 80%.

SYNTHESIS EXAMPLE 3

A 15 ml ampoule was charged with β-tosyloxyethylmethacrylate 2 g, methylmethacrylate 2 g, methylethylketone 5 ml and azobisdimethylvaleronitrile 10 mg as a polymerization initiator.

The reaction mass was maintained at 60°–63° C. for about 4 hours in an atmosphere of nitrogen gas, and then slowly poured into 200 ml of ethyl ether with stirring.

The product was obtained as a white precipitate in a yield of 60% which had an intrinsic viscosity [η], as measured at 30° C. using dimethylformamide as a solvent, of 1.16.

SYNTHESIS EXAMPLE 4

The same polymerization reaction as described in Example 3 was carried out using
(1) β-Tosyloxyethylmethacrylate (TsMA)
(2) β-Cinnamoyloxyethylmethacrylate (CiMA)
(3) Methylmethacrylate (MMA)
(4) Azobisdimethylvaleronitrile (AIVN)
(5) Methylethylketone (MEK)

The quantity of monomer, solvent, initiator, yield and reaction time in minutes are shown as follows.

| No. | TsMA g | CiMA g | MMA g | AIVN mg | NEK ml | minutes | yield % |
|---|---|---|---|---|---|---|---|
| 1 | 2 | 2 | — | 10 | 10 | 95 | 40 |
| 2 | 1 | 2 | 1 | 10 | 10 | 90 | 40 |
| 3 | 2 | 2 | — | 10 | 5 | 140 | 85 |
| 4 | 1 | 2 | 1 | 10 | 5 | 140 | 85 |

The reaction mass obtained in No. 3 and 4 was very viscous and was diluted with methylethylketone before precipitation. The polymers 3 and 4 had a [η], larger than 1.5.

EXAMPLE 1

A methyl ethyl ketone solution containing 30% by weight of the high polymer compound obtained in Synthesis Example 1 was prepared. To this was added a 8% by weight based in the polymer of tetranitrofluorenone as a sensitizer and, after stirring well, the mixture was applied to an anodized aluminum plate for use in printing. The coated plate was then dried. The coating was conducted using a coating rod No. 26. A line original was superposed on the resulting coated material, which was then exposed to a 450 W high pressure mercury lamp spaced at a distance of 10 cm. After continuing the irradiation for 5 minutes, the light-sensitive material was immersed in a methyl ethyl ketone solution containing an oil-soluble ink. Upon rubbing the surface of the aluminum plate with absorbent cotton, the ink adhered to the image areas due to the oleophilicity thereof. Thus, distinct images were obtained. The non-image areas were dissolved away by the methyl ethyl ketone to expose the aluminum plate where essentially no ink adhered. When the concentration of the coating solution was reduced to 8% or when a coating rod No. 60 was used, substantially the same results were also obtained.

EXAMPLE 2

The same procedures as described in Example 1 were conducted using the product obtained in Synthesis Example 2. That is, a methyl ethyl ketone-dimethylformamide solution (1:1 volume ratio) containing approximately 10% by weight of the high polymer compound was prepared. To this was added a 8% by weight based on the polymer of tetranitrocarbazole as a sensitizer and, after stirring well, the mixture was coated on an aluminum plate. The coated plate was then dried. After irradiating the coating for about 10 minutes, the light-sensitive material was immersed in methyl ethyl ketone to dissolve away the non-image areas. The irradiated areas remained on the aluminum plate slightly tinged a slight yellow color due to print-out. This image formation was confirmed using an oily ink to obtain colored images.

EXAMPLE 3

The same procedures as described above were conducted using a polymer solution containing a pigment dispersed therein. 5 wt.% of zinc oxide (0.2-2 microns in particle diameter) was added, as a white pigment, in a small amount, and 10 wt.% 5-nitroacenaphthene was added thereto as a sensitizing agent. After stirring well, the mixture was applied to an aluminum plate, with the coated plate then being dried to obtain a dry thickness of about 3μ. After irradiating the light-sensitive material for 10 minutes, the material was processed with a methyl ethyl ketone-trichlene mixed solvent (1:1 by volume) to obtain images. Where phthalocyanine was used as the pigment, blue images were obtained.

EXAMPLE 4

The procedures of Example 1 were repeated but in the absence of the tetranitrofluorenone as a sensitizer.

After 15 min. of irradiation, the layer was washed with methyl ethyl ketone and no image was obtained.

While the invention has been described in detail and with reference to specific embodiments thereof, it will be apparent to one skilled in the art that various changes and modifications can be made therein without departing from the spirit and scope thereof.

What is claimed is:

1. A functional group containing homopolymer or copolymer having aromatic sulfonic acid ester or amido groups, said homopolymer or copolymer containing therein monomer units of the general formula

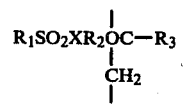

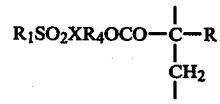

or

-continued

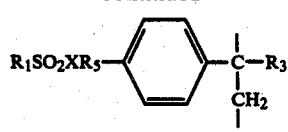

wherein
R₁ is

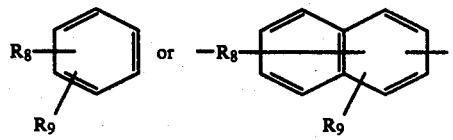

R₂ is

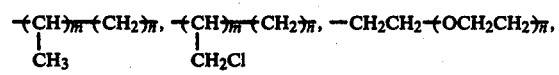

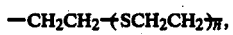

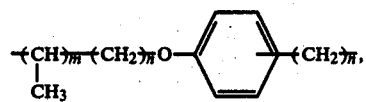

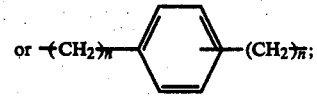

R₃ is a hydrogen atom or a methyl group;
R₄ is

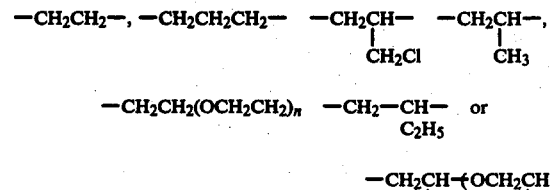

R₅ is $-(CH_2)_m-$;
m is 0 or 1;
n is 1, 2, 3 or 4;
x is —O—, —S—, —NH— or —NR₁₀—;
R₈ is a hydrogen atom, a chlorine atom, a bromine atom, a fluorine atom $H-(CH_2)_n-$, $H-(CH_2)_nO-$, a nitro group, a sulfo group or a carboxy group; and
R₉ is a hydrogen atom, a bromine atom, a fluorine atom, a chlorine atom, $H-(CH_2)_n-$, $H-(CH_2)_nO-$, a nitro group, a sulfo group, a carboxy group, a cyano group, a phenyl group, an acetyl group, a phenoxy group, or a benzoyl group; and
R₁₀ is

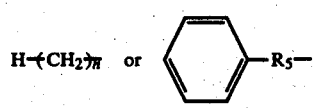

and in the case of said copolymer, polymerized units of unsaturated comonomer copolymerizable with said monomer.

2. The homopolymer or copolymer of claim 1, wherein said polymer contains said monomer units at a level of at least 2 mol %.

3. The homopolymer or copolymer of claim 1, wherein said polymer contains monomer units of the formula

wherein R₁, R₃, R₄ and X are as defined in claim 1.

4. The homopolymer or copolymer of claim 1, wherein said polymer contains monomer units of the formula

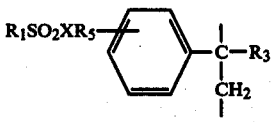

wherein R₁, R₃, R₅ and X are as described in claim 1.

5. A process for obtaining a polymer comprising homopolymerizing monomers having the general formula

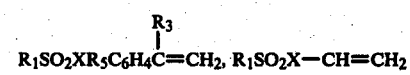

wherein
R₁ is

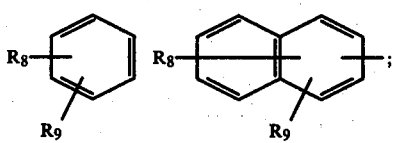

R₂ is

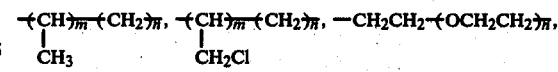

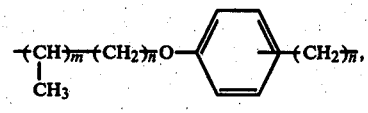

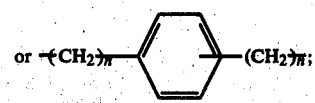

$R_3$ is a hydrogen atom or a methyl group;
$R_4$ is $-CH_2CH_2-$, $-CH_2CH_2CH_2-$, $-CH_2-\underset{\underset{CH_2Cl}{|}}{CH}-$, $-CH_2\underset{\underset{CH_3}{|}}{CH}-$, $-CH_2CH_2(OCH_2CH_2)_n-$, $-CH_2-\underset{\underset{C_2H_5}{|}}{CH}-$ or, $-CH_2\underset{\underset{CH_3}{|}}{CH}(OCH_2\underset{\underset{CH_3}{|}}{CH})_n-$;

$R_5$ is $(CH_2)_m$;
$R_8$ is a hydrogen atom, a chlorine atom, a bromine atom, a fluorine atom, $H-(CH_2)_n$, $H-(CH_2)_nO-$, a nitro group, a sulfo group or a carboxy group;
$R_9$ is a hydrogen atom, a bromine atom, a fluorine atom, a chlorine atom, $H-(CH_2)_n$, a nitro group, a sulfo group, a carboxy group, a cyano group, a phenyl group, an acetyl group, a phenoxy group, or a benzoyl group and
$R_{10}$ is $H-(CH_2)_n$ or ⌬$-R_5-$;

X is $-O-$, $-S-$, $-NH-$, or $-NR_{10}-$;
n is 1, 2, 3 or 4;
m is 0 or 1;
or copolymerizing at least one monomer of the above general formulas with another unsaturated monomer copolymerizable therewith, the amount of said monomer being present to provide at least 0.001 mol percent substitution of said polymer.

6. A homopolymer of or copolymer having therein a degree of substitution of at least 0.001 mol percent of monomer units of the formula $-CH_2-\underset{\underset{COOR_4OSO_2-}{|}}{\overset{\overset{R_3}{|}}{C}}-$⌬$\underset{R_9}{\overset{R_8}{}}$ wherein
$R_3$ is a hydrogen atom or a methyl group;
$R_4$ is $-CH_2CH_2-$, $-CH_2CH_2CH_2-$, $-CH_2-\underset{\underset{CH_2Cl}{|}}{CH}-$ $-CH_2\underset{\underset{CH_3}{|}}{CH}-$, $-CH_2CH_2(OCH_2CH_2)_n-$, $-CH_2-\underset{\underset{C_2H_5}{|}}{CH}-$ or $-CH_2\underset{\underset{CH_3}{|}}{CH}(OCH_2\underset{\underset{CH_3}{|}}{CH})_n-$ $R_8$ is a hydrogen atom, a chlorine atom, a bromine atom, a fluorine atom, $H-(CH_2)_n$, $H-(CH_2)_nO-$, a nitro group, a sulfo group or a carboxy group;

$R_9$ is a hydrogen atom, a bromine atom, a fluorine atom, a chlorine atom, $H-(CH_2)_n$, $H-(CH_2)_nO-$, a nitro group, a sulfo group, a carboxy group, a cyano group, a phenyl group, an acetyl group, a phenoxy group, or a benzoyl group, n is 1, 2, 3 or 4 and in the case of said copolymer, also containing polymerized units of an unsaturated comonomer copolymerizable with said monomer.

7. A process for preparing the polymer of claim 6, which comprizises homopolymerizing at least one compound having the general formula $CH_2=\underset{\underset{COOR_4OSO_2-}{|}}{CR_3}$⌬$-R_9$ wherein
$R_3$ is a hydrogen atom or a methyl group;
$R_4$ is $-CH_2CH_2-$, $-CH_2CH_2CH_2-$, $-CH_2-\underset{\underset{CH_2Cl}{|}}{CH}-$, $-CH_2\underset{\underset{CH_3}{|}}{CH}-$, $-CH_2CH_2(OCH_2CH_2)_n-$, $-CH_2-\underset{\underset{C_2H_5}{|}}{CH}-$ or $-CH_2\underset{\underset{CH_3}{|}}{CH}(OCH_2\underset{\underset{CH_3}{|}}{CH})_n-$;

$R_9$ is a hydrogen atom, a bromine atom, a fluorine atom, a chlorine atom, $H-(CH_2)_n$, $H-(CH_2)_nO-$, a nitro group, a sulfo group, a carboxy group, a cyano group, a phenyl group, an acetyl group, a phenoxy group, or a benzoyl group and
n is 1, 2, 3 or 4;
or copolymerizing said monomer with an unsaturated comonomer copolymerizable therewith.

8. A process for preparing a polymer of claim 6, which comprises treating a polymer having the following monomer unit $-CH_2-\underset{\underset{COOR_4OH}{|}}{\overset{\overset{R_3}{|}}{C}}$ wherein
$R_3$ is a hydrogen atom or a methyl group;
$R_4$ is $-CH_2CH_2-$, $-CH_2CH_2CH_2-$, $-CH_2-\underset{\underset{CH_2Cl}{|}}{CH}-$ $-CH_2\underset{\underset{CH_3}{|}}{CH}-$, $-CH_2CH_2(OCH_2CH_2)_n-$, $-CH_2-\underset{\underset{C_2H_5}{|}}{CH}-$ or $-CH_2\underset{\underset{CH_3}{|}}{CH}(OCH_2\underset{\underset{CH_3}{|}}{CH})_n-$;

n is 1, 2, 3 or 4,
with an aromatic sulfonyl chloride of the general formula

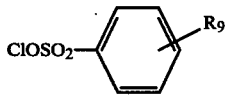

wherein $R_9$ is a hydrogen atom, a bromine atom, a fluorine atom, a chlorine atom, $H\text{-}(CH_2)_n\text{-}$, $H\text{-}(CH_2)_nO\text{-}$, a nitro group, a sulfo group, a carboxy group, a cyano group, a phenyl group, an acetyl group, a phenoxy group, or a benzoyl group.

9. The polymer of claim 6 wherein $R_3$ is a methyl group, $R_4$ is $-CH_2CH_2-$, $R_8$ is a hydrogen atom and $R_9$ is para-methyl.

10. The polymer of claim 6 wherein said monomer is copolymerized with methyl methacrylate.

11. The process of claim 5 wherein said monomer is selected from the group consisting of monomers having the general formula

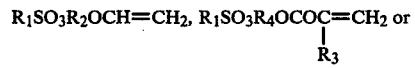

12. A polymer of polymerized hydroxyalkylmethacrylate sulfo esters characterized by monomer units of the formula

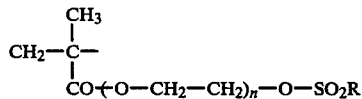

wherein n is an integer equal to 1 or 2 and R is selected from the group consisting of $C_6H_5-$, and $p-CH_3C_6H_4-$.

13. A polymer according to claim 12, wherein said sulfo ester is ethylenemethacrylate toluene sulfonate.

14. A polymer according to claim 12 containing at least one copolymerizable monomer selected from the group consisting of styrene, methacrylic acid esters or acrylic acid esters, acrylamide, methacrylamide, and acrylonitrile in copolymerized form.

15. A polymer according to claim 14 wherein said sulfo ester is ethylenemethacrylate toluene sulfonate and said copolymerizable monomer is styrene.

16. A polymer characterized by hydroxyalkylmethacrylate sulfo ester monomer units of the formula

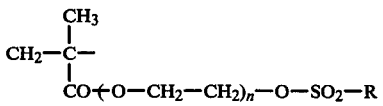

wherein n is an integer equal to 1 or 2 and R is selected from the group consisting of $C_6H_5-$, $p-CH_3C_6H_4-$ and $CH_3-$.

17. A polymer characterized by hydroxyalkylmethacrylate sulfo ester monomer units of the formula

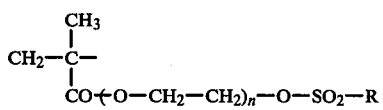

wherein n is an integer equal to 1 or 2 and R is selected from the group consisting of $C_6H_5-$, $CH_3C_6H_4-$ and $CH_3-$.

18. A polymer according to claim 16 wherein said sulfo ester monomer unit is ethylenemethacrylate toluene sulfonate.

19. A polymer according to claim 14 wherein said sulfo ester monomer unit is ethylenemethacrylate toluene sulfonate and said copolymerizable monomer is styrene.

* * * * *